(12) United States Patent
Kim et al.

(10) Patent No.: US 12,525,526 B2
(45) Date of Patent: Jan. 13, 2026

(54) SEMICONDUCTOR PACKAGE AND METHOD OF MANUFACTURING THE SEMICONDUCTOR PACKAGE

(71) Applicant: SAMSUNG ELECTRONICS CO., LTD., Suwon-si (KR)

(72) Inventors: Jingu Kim, Suwon-si (KR); Yieok Kwon, Suwon-si (KR); Wooyoung Kim, Suwon-si (KR); Gongje Lee, Suwon-si (KR); Sangkyu Lee, Suwon-si (KR); Bongju Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 315 days.

(21) Appl. No.: 18/215,292

(22) Filed: Jun. 28, 2023

(65) Prior Publication Data

US 2024/0162135 A1  May 16, 2024

(30) Foreign Application Priority Data

Nov. 10, 2022 (KR) .................. 10-2022-0149484

(51) Int. Cl.
*H01L 23/498* (2006.01)
*H01L 21/48* (2006.01)
(Continued)

(52) U.S. Cl.
CPC .... *H01L 23/49838* (2013.01); *H01L 21/4857* (2013.01); *H01L 21/56* (2013.01);
(Continued)

(58) Field of Classification Search
None
See application file for complete search history.

(56) References Cited

U.S. PATENT DOCUMENTS

| 7,862,987 B2 | 1/2011 | Daubenspeck et al. |
| 11,241,839 B2 | 2/2022 | McClintock et al. |

(Continued)

FOREIGN PATENT DOCUMENTS

| CN | 103123896 A | 5/2013 |
| JP | 2000-260765 A | 9/2000 |

(Continued)

*Primary Examiner* — Michelle Mandala
(74) *Attorney, Agent, or Firm* — Muir Patent Law, PLLC

(57) ABSTRACT

A semiconductor package includes a lower redistribution wiring layer; and a first semiconductor device on the lower redistribution wiring layer, the first semiconductor device being connected to the lower redistribution wiring layer via conductive bumps, wherein the lower redistribution wiring layer includes: a first redistribution wire in a first lower insulating layer; an insulating structure layer having an opening that exposes a portion of the first redistribution wire, the insulating structure layer including a first photosensitive insulating layer, a light blocking layer on the first photosensitive insulating layer, and a second photosensitive insulating layer on the light blocking layer; a second redistribution wire in the opening of the insulating structure layer, the second redistribution wire including a redistribution via contacting the first redistribution wire, and a redistribution line stacked on the redistribution via; and bonding pads bonded to the conductive bumps and electrically connected to the second redistribution wire.

20 Claims, 18 Drawing Sheets

(51) Int. Cl.
  *H01L 21/56* (2006.01)
  *H01L 23/00* (2006.01)
  *H01L 23/31* (2006.01)
  *H01L 25/00* (2006.01)
  *H01L 25/065* (2023.01)
  *H01L 23/29* (2006.01)

(52) U.S. Cl.
  CPC .... *H01L 23/3128* (2013.01); *H01L 23/49822* (2013.01); *H01L 24/16* (2013.01); *H01L 25/0657* (2013.01); *H01L 25/50* (2013.01); *H01L 23/291* (2013.01); *H01L 23/295* (2013.01); *H01L 23/49894* (2013.01); *H01L 24/29* (2013.01); *H01L 24/32* (2013.01); *H01L 24/73* (2013.01); *H01L 2224/16227* (2013.01); *H01L 2224/2919* (2013.01); *H01L 2224/32225* (2013.01); *H01L 2224/73204* (2013.01); *H01L 2225/06517* (2013.01); *H01L 2225/06524* (2013.01); *H01L 2225/06548* (2013.01); *H01L 2924/0665* (2013.01)

(56) References Cited

U.S. PATENT DOCUMENTS

| | | | |
|---|---|---|---|
| 2007/0121273 A1* | 5/2007 | Yamamoto | H01G 4/232 257/E23.07 |
| 2019/0385962 A1 | 12/2019 | Ranmuthu et al. | |
| 2022/0020714 A1* | 1/2022 | Choi | H01L 23/49816 |
| 2023/0146085 A1* | 5/2023 | Kang | H01L 25/50 257/668 |

FOREIGN PATENT DOCUMENTS

| | | |
|---|---|---|
| JP | 5507697 B2 | 5/2014 |
| JP | 5560775 B2 | 7/2014 |
| KR | 10-2021-0135096 A | 11/2021 |

* cited by examiner

SEMICONDUCTOR PACKAGE AND METHOD OF MANUFACTURING THE SEMICONDUCTOR PACKAGE

CROSS-REFERENCE TO RELATED APPLICATIONS

This application claims priority under 35 U.S.C. § 119 to Korean Patent Application No. 10-2022-0149484, filed on Nov. 10, 2022, in the Korean Intellectual Property Office (KIPO), the contents of which are herein incorporated by reference in their entirety.

BACKGROUND

1. Field

Embodiments relate to a semiconductor package and a method of manufacturing the semiconductor package.

2. Description of the Related Art

In a wafer level package (WL-PKG) technology, photosensitive polymers that react to light may be used to form a redistribution layer (RDL).

SUMMARY

The embodiments may be realized by providing a semiconductor package including a lower redistribution wiring layer having a first surface and a second surface opposite to the first surface; and a first semiconductor device on the lower redistribution wiring layer, the first semiconductor device being connected to the lower redistribution wiring layer via conductive bumps, wherein the lower redistribution wiring layer includes a first redistribution wire in a first lower insulating layer; an insulating structure layer having an opening that exposes at least a portion of the first redistribution wire, the insulating structure layer including a first photosensitive insulating layer, a light blocking layer on the first photosensitive insulating layer, and a second photosensitive insulating layer on the light blocking layer; a second redistribution wire in the opening of the insulating structure layer, the second redistribution wire including a redistribution via contacting the first redistribution wire, and a redistribution line stacked on the redistribution via; and bonding pads bonded to the conductive bumps and electrically connected to the second redistribution wire.

The embodiments may be realized by providing a method of manufacturing a semiconductor package, the method including forming a lower redistribution wiring layer having a first lower insulating layer such that the lower insulating layer includes a plurality of first redistribution wires therein; sequentially forming a first photosensitive insulating layer, a light blocking layer, and a second photosensitive insulating layer on the first lower insulating layer to cover the first redistribution wires; forming a second through hole penetrating the second photosensitive insulating layer to expose the light blocking layer; etching the light blocking layer exposed through the second through hole to expose the first photosensitive insulating layer; forming a first through hole penetrating the first photosensitive insulating layer to expose the first redistribution wire; and forming a second redistribution wire electrically connected to the first redistribution wire through the first and second through holes.

The embodiments may be realized by providing a semiconductor package including a lower redistribution wiring layer having upper and lower surfaces opposite to each other, the lower redistribution wiring layer having bonding pads that are exposed at the upper surface; a first semiconductor device on the lower redistribution wiring layer, the first semiconductor device being connected to the lower redistribution wiring layer via conductive bumps; a molding member covering the first semiconductor device on the lower redistribution wiring layer; a conductive connector penetrating the molding member around the first semiconductor device, the conductive connector being electrically connected to the bonding pads; an upper redistribution wiring layer on the molding member, the upper redistribution wiring layer being electrically connected to the lower redistribution wiring layer through the conductive connector; and a second semiconductor device on the upper redistribution wiring layer, wherein the lower redistribution wiring layer includes an insulating layer having an opening that exposes at least a portion of a first redistribution wire, the insulating layer including a positive photosensitive insulating layer, a light blocking layer on the positive photosensitive insulating layer, and a negative photosensitive insulating layer on the light blocking layer; and a second redistribution wire in the opening of the insulating layer, the second redistribution wire contacting the at least a portion of the first redistribution wire.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
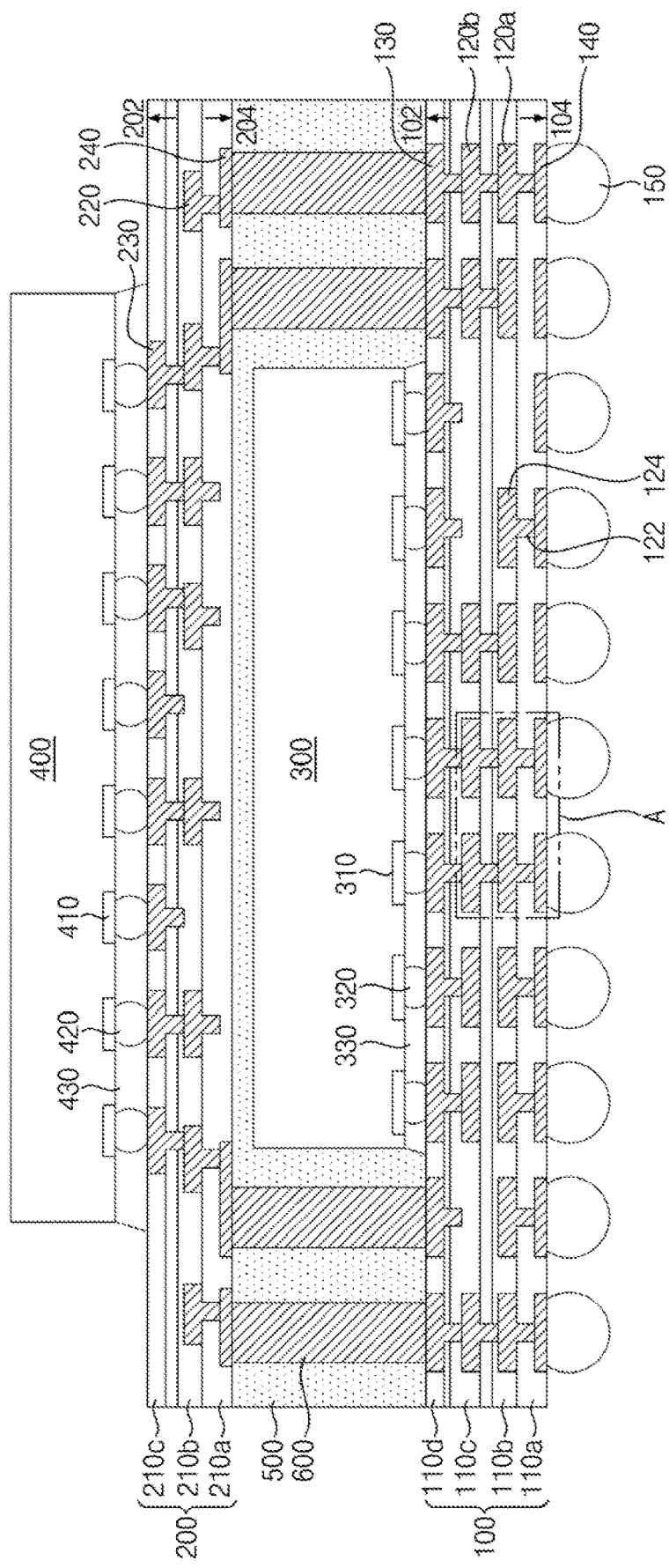
FIG. 1 is a cross-sectional view illustrating a semiconductor package in accordance with example embodiments.
Figure 2:
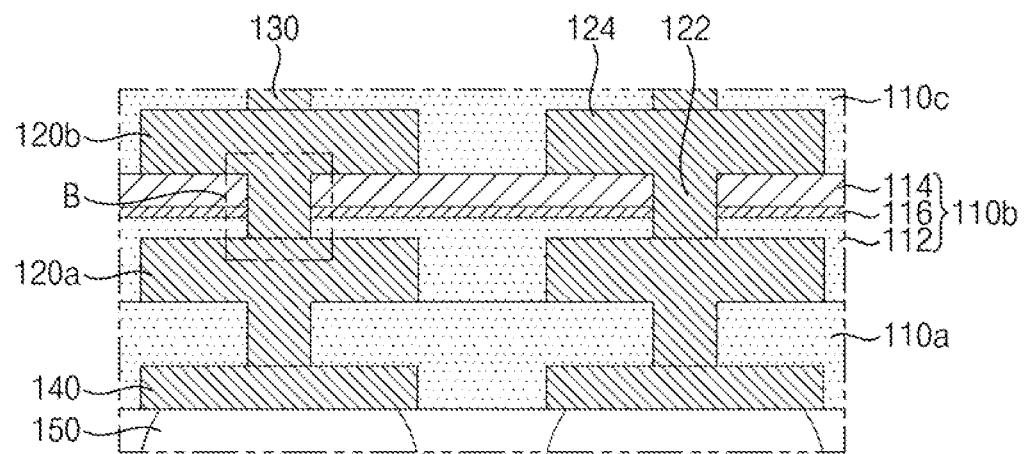
FIG. 2 is an enlarged cross-sectional view illustrating portion 'A' in FIG. 1.
Figure 3:
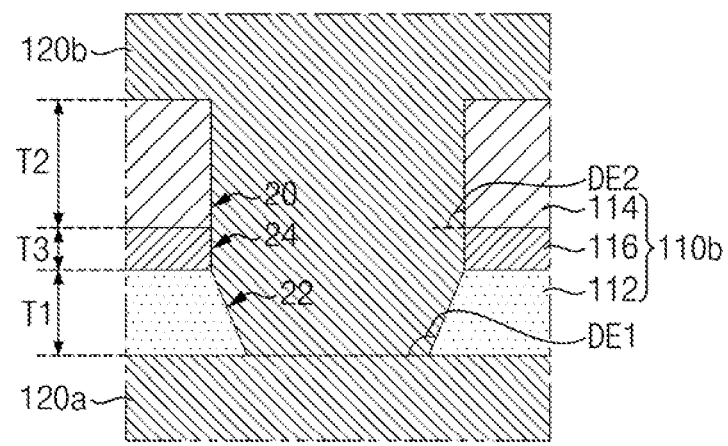
FIG. 3 is an enlarged cross-sectional view illustrating portion 'B' in FIG. 2.

FIG. 1 is a cross-sectional view illustrating a semiconductor package in accordance with example embodiments. FIG. 2 is an enlarged cross-sectional view illustrating portion 'A' in FIG. 1. FIG. 3 is an enlarged cross-sectional view illustrating portion 'B' in FIG. 2.

Referring to FIGS. 1 to 3, a semiconductor package 10 may include a first redistribution wiring layer 100, a second redistribution wiring layer 200, and a conductive connector 600 electrically connecting a first semiconductor device 300 (on the first redistribution wiring layer 100), the first redistribution wiring layer 100, and the second redistribution wiring layer 200 to each other. The semiconductor package 10 may further include a molding member 500 (on the first redistribution wiring layer 100 and covering the first semiconductor device 300) and a second semiconductor device 400 on the second redistribution wiring layer 200. The second redistribution wiring layer 200 may be on the molding member 500. As used herein, the terms "first," "second," and the like are merely for identification and differentiation, and are not intended to imply or require sequential inclusion (e.g., a third element and a fourth element may be described without implying or requiring the presence of a first element or second element).

In an implementation, the first redistribution wiring layer (e.g., lower redistribution wiring layer) 100 may include a first upper surface 102 and a first lower surface 104 that are opposite to each other. The first redistribution wiring layer 100 may include a plurality of redistribution wires 120a and 120b. The first redistribution wiring layer 100 may include a plurality of first bonding pads 130 exposed at the upper surface of the first redistribution wiring layer 100, e.g., the first upper surface 102, and a plurality of first connecting pads 140 exposed at the lower surface of the first redistribution wiring layer 100, e.g., the first lower surface 104.

In an implementation, the first redistribution wiring layer 100 may include a plurality of lower insulating layers (insulating structure layers) 110a, 110b, 110c, and 110d, and the redistribution wires 120a and 120b may be in the insulating layers. The insulating layers may include, e.g., a polymer or a dielectric layer. The insulating layers may be formed by, e.g., a vapor deposition process, a spin coating process, or the like. The redistribution wires may be formed by, e.g., a plating process, an electroless plating process, a vapor deposition process, or the like. The redistribution wires may electrically connect the first bonding pads 130 and the first connecting pads 140.

In an implementation, the lower insulating layers 110a, 110b, 110c, and 110d may cover the redistribution wires 120a and 120b. The first lower insulating layer 110a may be at the first lower surface 104 of the first redistribution wiring layer 100, and the fourth lower insulating layer 110d (e.g., uppermost insulating layer) may be at the first upper surface 102 of the first redistribution wiring layer 100.

In an implementation, the plurality of first bonding pads 130 may be in the fourth lower insulating layer 110d. Upper surfaces of the first bonding pads 130 may be exposed at the upper surface of the fourth lower insulating layer 110d, e.g., the first upper surface 102. The fourth lower insulating layer 110d may have fourth openings that expose the upper surfaces of the first bonding pads 130.

The plurality of first connecting pads 140 may be in the first lower insulating layer 110a. Lower surfaces of the first connecting pads 140 may be exposed at the lower surface of the first lower insulating layer 110a, e.g., the first lower surface 104. The first lower insulating layer 110a may have first openings that expose upper surfaces of the first connecting pads 140.

The first redistribution wire 120a may be on the first lower insulating layer 110a, and may contact the first connecting pad 140 through the first opening. The second lower insulating layer 110b may be on the first lower insulating layer 110a, and may have a second opening that exposes the first redistribution wire 120a.

The second redistribution wire 120b may be on the second lower insulating layer 110b, and may contact the first redistribution wire 120a through the second opening. The third lower insulating layer 110c may be on the second lower insulating layer 110b, and may have a third opening that exposes the second redistribution wire 120b.

The first bonding pad 130 may be on the third lower insulating layer 110c, and may contact the second redistribution wire 120b through the third opening. The fourth lower insulating layer 110d may be on the third lower insulating layer 110c, and may have a fourth opening that exposes the first bonding pad 130. Thus, the plurality of first bonding pads 130 may be exposed at the upper surface of the fourth lower insulating layer 110d, e.g., the first upper surface 102.

The first bonding pads 130, the first connecting pads 140, and the redistribution wires 120a and 120b may each include a metal material. In an implementation, the metal material may include, e.g., nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), tin (Sn), or alloys thereof. As used herein, the term "or" is not an exclusive term, e.g., "A or B" would include A, B, or A and B.

In an implementation, the redistribution wires 120a and 120b may each include a redistribution via 122 in at least one of the first to fourth openings that penetrates the corresponding insulating layer, and a redistribution line 124 on the redistribution via 122 and extending along the upper surface of the corresponding insulating layer. In an implementation, the redistribution via 122 may be below the redistribution line 124 toward the first lower surface 104 of the first redistribution wiring layer 100. In an implementation, the semiconductor package 10 may include a chip last structure.

In an implementation, the second lower insulating layer 110b may include a first photosensitive insulating layer 112, a light blocking layer 116 on the first photosensitive insulating layer 112, and a second photosensitive insulating layer 114 on the light blocking layer 116. In an implementation, any of the first to fourth lower insulating layers 110a, 110b, 110c, and 110d may include the first and second photosensitive insulating layers 112 and 114, and the light blocking layer 116 between the first and second photosensitive insulating layers 112 and 114. The first and second photosensitive insulating layers 112 and 114 may include a polymer material that hardens or softens in response to light.

As illustrated in FIG. 3, the first photosensitive insulating layer 112 may have a first through hole 22 therein that constitutes a first portion of the second opening. The first through hole 22 may cover or surround at least a portion of an outer surface of the redistribution via 122. The first through hole 22 may have a first tapered shape or a tapered first sidewall profile. The tapered first sidewall profile of the first through hole 22 may become narrower toward or closer to the first lower surface 104 of the first redistribution wiring layer 100.

The first photosensitive insulating layer 112 may have a first thickness T1 on the first redistribution wire 120a. A sidewall of the first through hole 22 may have a first angle DE1 from a horizontal direction or relative to a horizontal plane. In an implementation, the first thickness T1 may be within a range of 1 μm to 5 μm. The first angle DE1 may be within an obtuse angle range of 100 degrees to 140 degrees.

The first photosensitive insulating layer 112 may include a positive photosensitive insulating material. A molecular structure of the positive photosensitive insulating material may be destroyed in response to exposure to light. The molecular structure of the positive photosensitive insulating material that is irradiated by light having strong light intensity may be completely decomposed, and the positive photosensitive insulating material may not leave residues.

The second photosensitive insulating layer 114 may have a second through hole 20 therein that constitutes a second portion of the second opening. The second through hole 20 may cover or surround at least a portion of the outer surface of the redistribution via 122. The second through hole 20 may have a second sidewall profile.

The second photosensitive insulating layer 114 may have a second thickness T2. A sidewall of the second through hole 20 may have a second angle DE2 from or relative to the horizontal direction or plane. In an implementation, the second thickness T2 may be within a range of 5 μm to 50 μm. The second angle DE2 may be within a range of, e.g., 80 degrees to 100 degrees.

The second photosensitive insulating layer 114 may include a negative photosensitive insulating material. A molecular structure of the negative photosensitive insulating material may be more strongly bonded in response to exposure to light. In an implementation, the negative photosensitive insulating material that is irradiated by light having linearity may be harden, and the hardened negative photosensitive insulating material may form the second angle DE2 of the sidewall of the second through hole 20 that is smaller than the first angle DE1 of the sidewall of the first through hole 22.

In an implementation, the first and second photosensitive insulating layers 112 and 114 may each independently include, e.g., a polyimide, plumbate oxide, polyhydroxystyrene, benzocyclobutene, or an acryl or acrylic material.

The light blocking layer 116 may be between the first and second photosensitive insulating layers 112 and 114. The light blocking layer 116 may have a third through hole 24 therein that constitutes a third portion of the second opening. The third through hole 24 may cover or surround at least a portion of the outer surface of the redistribution via 122.

The light blocking layer 116 may block transmission of light between the first and second photosensitive insulating layers 112 and 114 during an exposure process. The light blocking layer 116 may block light that is irradiated onto the second photosensitive insulating layer 114 from being irradiated onto the first photosensitive insulating layer 112. The light blocking layer 116 may have a third thickness. In an implementation, the third thickness T3 may be within a range of 0.1 μm to 1 μm.

The light blocking layer 116 may include, e.g., a metal oxide, a metal nitride, a metal carbide, a metal boride, an organic material, an organic resin, an inorganic filler, or an organic filler.

In an implementation, the first redistribution wiring layer 100 may be connected to other semiconductor devices through external connection bumps 150 as conductive connection members. The external connection bumps 150 may be on the first connecting pads 140. In an implementation, the external connection bumps 150 may include a C4 bump. The first connecting pads 140 of the first redistribution wiring layer 100 may be electrically connected to a substrate pad of a package substrate through the external connection bumps 150.

In an implementation, the first semiconductor device 300 may be on the first redistribution wiring layer 100. The first semiconductor device 300 may be on a chip mounting region of the first redistribution wiring layer 100. The first semiconductor device 300 may be on the first redistribution wiring layer 100 by a flip chip bonding method. In an implementation, the first semiconductor device 300 may be on the first redistribution wiring layer 100 such that an active surface on which first chip pads 310 are formed faces the first redistribution wiring layer 100. The first chip pads 310 of the first semiconductor device 300 may be electrically connected to the first bonding pads 130 of the first redistribution wiring layer 100 through first conductive bumps 320 as the conductive connection members. In an implementation, the first conductive bumps 320 may include micro bumps (uBumps).

A first adhesive member 330 may be between the first redistribution wiring layer 100 and the first semiconductor device 300. In an implementation, the first adhesive member 330 may include an epoxy material.

In an implementation, the molding member 500 may cover the first redistribution wiring layer 100, the first semiconductor device 300, and the conductive connectors 600. The molding member 500 may be on the first redistribution wiring layer 100 to fill a space between the first and second redistribution wiring layers 100 and 200. The molding member 500 may include a plurality of through openings through which the conductive connector 600 may be inserted or pass. One end of the conductive connector 600 within the through opening may be connected to a first bonding pad 130 of the first redistribution wiring layer 100, and the other end of the conductive connector 600 within the through opening may be connected to a second connecting pad 240 of the second redistribution wiring layer 200.

The second redistribution wiring layer 200 may be on an upper surface of the molding member 500. The molding member 500 may have a parallel upper surface on which the second redistribution wiring layer 200 is arranged. In an implementation, the molding member 500 may include an epoxy molding compound (EMC).

In an implementation, the conductive connector 600 may penetrate the molding member 500 in a vertical direction to electrically connect the first redistribution wiring layer 100 and the second redistribution wiring layer 200. The conductive connector 600 may be around the first semiconductor device 300 that is on the chip mounting region. The conductive connector 600 may be in the through opening of the molding member 500. The conductive connector 600 may extend from the first redistribution wiring layer 100 in the same vertical direction as the thickness direction of the first redistribution wiring layer 100.

In an implementation, the conductive connector 600 may be electrically connected to the first bonding pad 130 of the first redistribution wiring layer 100. The conductive connector 600 may be electrically connected to the second connecting pad 240 of the second redistribution wiring layer 200. The conductive connector 600 may provide a signal movement path to electrically connect the first redistribution wiring layer 100 and the second redistribution wiring layer 200.

In an implementation, the conductive connector 600 may have a pillar shape or a bump shape. The conductive connector 600 may include, e.g., nickel (Ni), antimony (Sb), bismuth (Bi), zinc (Zn), indium (In), palladium (Pd), platinum (Pt), aluminum (Al), copper (Cu), molybdenum (Mo), titanium (Ti), gold (Au), silver (Ag), chromium (Cr), or tin (Sn). The conductive connector 600 may be formed by, e.g., a plating process, an electroless plating process, a vapor deposition process, or the like.

In an implementation, the second redistribution wiring layer (e.g., upper redistribution wiring layer) 200 may have a second upper surface 202 and a second lower surface 204 opposite to each other. The second redistribution wiring layer 200 may include a plurality of second bonding pads 230 that are exposed at the second upper surface 202, and a plurality of second connecting pads 240 that are exposed at the second lower surface 204. The second redistribution wiring layer 200 may be on the upper surface of the molding member 500. The second semiconductor device 400 may be on the second redistribution wiring layer 200.

The second redistribution wiring layer 200 may be electrically connected to the first redistribution wiring layer 100 through the conductive connector 600 that is electrically connected to the second connecting pad 240. The conductive connector 600 may penetrate the molding member 500 to electrically connect the second redistribution wiring layer 200 and the first redistribution wiring layer 100.

In an implementation, the second redistribution wiring layer 200 may include a plurality of upper insulating layers 210a, 210b, and 210c (e.g., fifth, sixth, and seventh insulating layers), and upper redistribution wires 220 in the upper insulating layers. The second bonding pad 230 and the second connecting pad 240 may be electrically connected through the upper redistribution wires 220.

In an implementation, the plurality of second bonding pads 230 may be in a seventh upper insulating layer (uppermost insulating layer) 210c. Upper surfaces of the second bonding pads 230 may be exposed at an upper surface of the seventh upper insulating layer 210c, e.g., the second upper surface 202. The seventh upper insulating layer 210c may have seventh openings that expose the upper surfaces of the second bonding pads 230.

The plurality of second connecting pads 240 may be in the fifth upper insulating layer 210a. Lower surfaces of the second connecting pads 240 may be exposed at a lower surface of the fifth upper insulating layer 210a, e.g., the second lower surface 204. The fifth upper insulating layer 510a may have fifth openings that expose the upper surfaces of the second connecting pads 240.

The upper redistribution wires 220 may be on the fifth upper insulating layer 210a, and may contact the second connecting pads 240 through the fifth openings. The sixth upper insulating layer 210b may be on the fifth upper insulating layer 210a, and may have sixth openings that expose the upper redistribution wires 220.

The second bonding pad 230 may be on the sixth upper insulating layer 210b, and may contact the upper redistribution wires 220 through the sixth openings. The seventh upper insulating layer 210c may be on the sixth upper insulating layer 210b, and may include seventh openings that expose the second bonding pads 230. Thus, the plurality of second bonding pads 230 may be exposed at the upper surface of the seventh upper insulating layer 210c, e.g., the second upper surface 202.

In an implementation, the upper insulating layers 210a, 210b, 210c may each independently include a first photosensitive insulating layer, a light blocking layer on the first photosensitive insulating layer, and a second photosensitive insulating layer on the light blocking layer. In an implementation, at least one of the fifth to seventh upper insulating layers 210a, 210b, and 210c may include the first and second photosensitive insulating layers, and the light blocking layer between the first and second photosensitive insulating layers.

In an implementation, the second semiconductor device 400 may be on the second redistribution wiring layer 200. The second semiconductor device 400 may be on a chip mounting region of the second redistribution wiring layer 200. The second semiconductor device 400 may be on the second redistribution wiring layer 200 by a flip chip bonding method. In an implementation, the second semiconductor device 400 may be on the second redistribution wiring layer 200 such that an active surface on which second chip pads 410 are formed faces the second redistribution wiring layer 200. The second chip pads 410 of the second semiconductor device 400 may be electrically connected to the second bonding pads 230 of the second redistribution wiring layer 200 through the second conductive bumps 420 as the conductive connecting members. In an implementation, the second conductive bumps 420 may include micro bumps (uBumps).

A second adhesive member 430 may be between the second redistribution wiring layer 200 and the second semiconductor device 400. In an implementation, the second adhesive member 430 may include an epoxy material.

Hereinafter, a method of manufacturing the semiconductor package in FIG. 1 will be described.

FIGS. 4 to 19 are cross-sectional views of stages in a method of manufacturing the semiconductor package in FIG. 1 in accordance with example embodiments.

Figure 4:
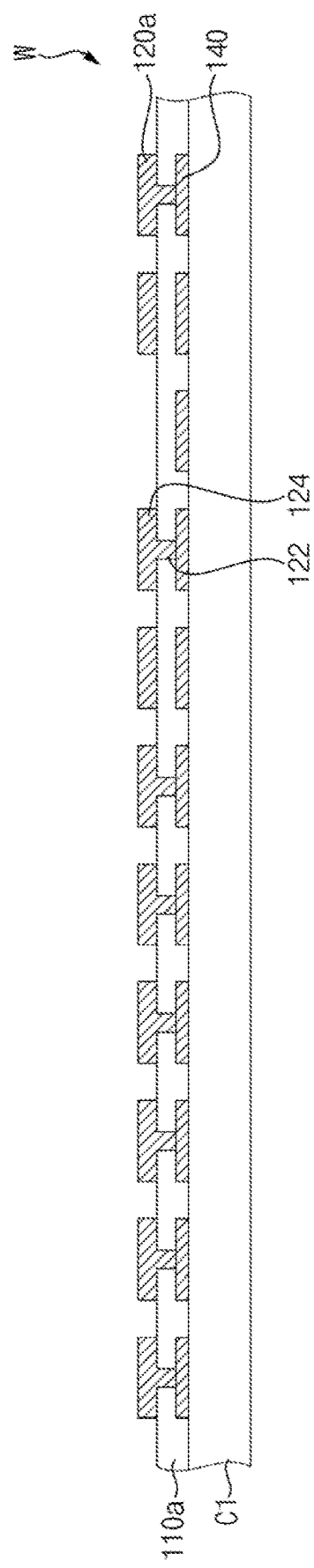
FIGS. 4 to 19 are cross-sectional views of stages in a method of manufacturing the semiconductor package in FIG. 1 in accordance with example embodiments.

Referring to FIG. 4, a semiconductor wafer having first redistribution wiring layers may be provided on a carrier substrate C1.

First, first connecting pads 140 may be formed on the carrier substrate C1, and a first lower insulating layer 110a may be formed on the first connecting pads 140. Then, the first lower insulating layer 110a may be patterned to form first openings that expose the first connecting pads 140.

In an implementation, the first lower insulating layer 110a may include a polymer or a dielectric layer. In an implementation, the first lower insulating layer 110a may include, e.g., a polyimide (PI), lead oxide (PbO), polyhydroxystyrene (PHS), novolac, or the like. The first lower insulating layer 110a may be formed by, e.g., a vapor deposition process, a spin coating process, or the like.

Figure 5:
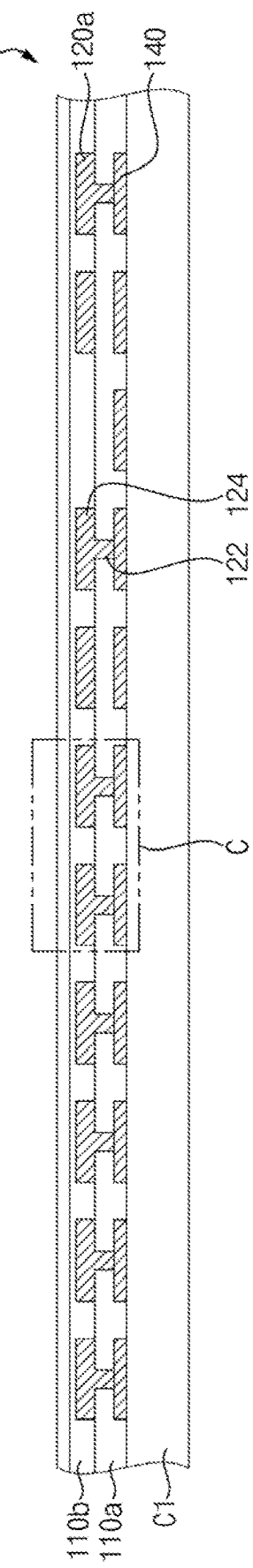
Figure 6:
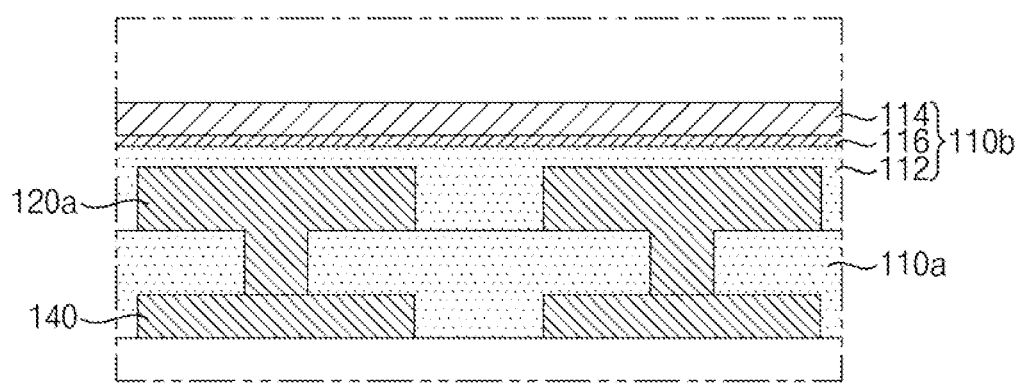

FIG. 6 is an enlarged cross-sectional view illustrating portion 'C' in FIG. 5.

Referring to FIGS. 5 and 6, a second lower insulating layer 110b may be formed on the first lower insulating layer 110a. The second lower insulating layer 110b may include a first photosensitive insulating layer 112, a light blocking layer 116 on the first photosensitive insulating layer 112, and a second photosensitive insulating layer 114 on the light blocking layer 116.

The first photosensitive insulating layer 112, the light blocking layer 116, and the second photosensitive insulating layer 114 may be sequentially formed on the first lower insulating layer 110a to cover the first connecting pads 140. The first and second photosensitive insulating layers 112 and 114 may include a polymer material that hardens or softens in response to light.

The first photosensitive insulating layer 112 may include a positive photosensitive insulating material. A molecular structure of the positive photosensitive insulating material may be destroyed in response to the light. The second photosensitive insulating layer 114 may include a negative photosensitive insulating material. A molecular structure of the negative photosensitive insulating material may be more strongly bonded, e.g., may harden, in response to the light.

The first photosensitive insulating layer 112 may have a first thickness T1 on a first redistribution wire 120a. The second photosensitive insulating layer 114 may have a second thickness T2. The light blocking layer 116 may have a third thickness. In an implementation, the second thickness T2 may be within a range of 1 μm to 5 μm. The second thickness T2 may be within a range of 5 μm to 50 μm. The third thickness T3 may be within a range of 0.1 μm to 1 μm.

In an implementation, the first and second photosensitive insulating layers 112 and 114 may include, e.g., a polyimide, plumbate oxide, polyhydroxystyrene, benzocyclobutene, or an acrylic material.

The light blocking layer 116 may include, e.g., a metal oxide, a metal nitride, a metal carbide, a metal boride, an organic material, an organic resin, an inorganic filler, or an organic filler.

Figure 7:
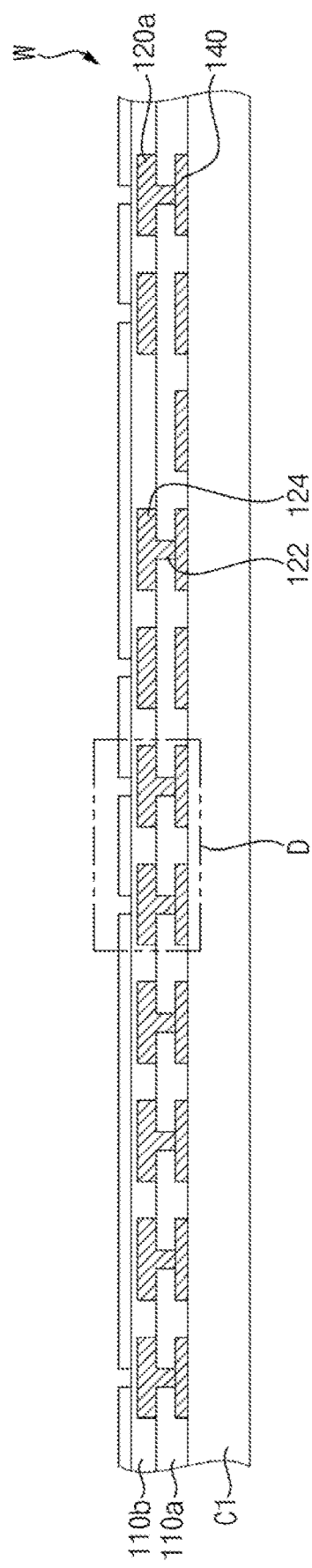
Figure 8:
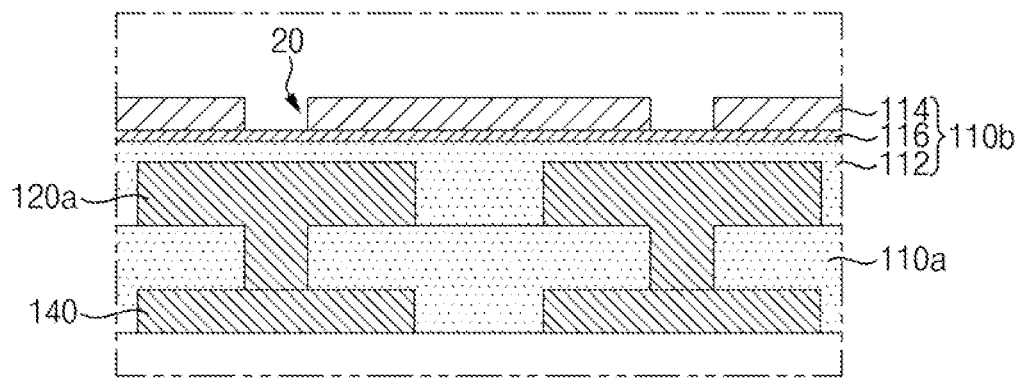
Figure 9:
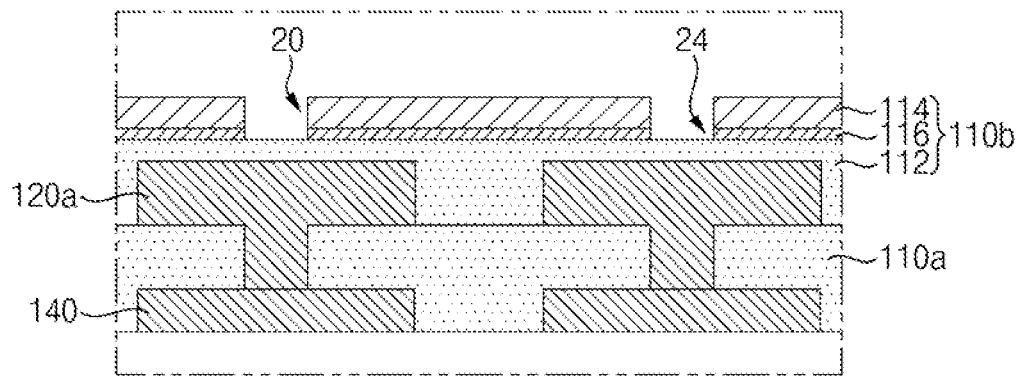

FIGS. 8 and 9 are enlarged cross-sectional views of portion 'D' in FIG. 7. Referring to FIGS. 7 to 9, second through holes 20 may be formed within the second photosensitive insulating layer 114 to later form second redistribution wires.

First, a first mask may be arranged on the second photosensitive insulating layer 114, and the light may be irradiated onto the first mask. The light may include extreme ultraviolet (EUV).

The first mask may have first patterns of or corresponding to second through holes 20. At least some of the light may pass through the first pattern, and may be irradiated onto the second photosensitive insulating layer 114, and at least some of the other light may be blocked by the first mask. Portions of the second photosensitive insulating layer 114 irradiated by the light may react to the light, and the molecular structure may be more strongly bonded. Portions of the second photosensitive insulating layer 114 not irradiated by the light may be removed to form the second through holes 20.

The portions of the second photosensitive insulating layer 114 not irradiated by the light may be removed by a wet developing process using a developing solution or a dry developing process using a developing gas. In an implementation, the developing solution may include tetramethylammonium hydroxide (TMAH). The developing gas may include, e.g., hydrogen ($H_2$), chlorine ($Cl_2$), fluorine ($F_2$), bromine ($Br_2$), iodine ($I_2$), hydrogen chloride (HCl), hydrogen fluoride (HF), hydrogen bromide (HBr), or hydrogen iodide (HI).

The light may have linearity, sidewalls of the second through holes 20 that are formed within the second photosensitive insulating layer 114 may have a small inclination. The sidewalls of the second through holes 20 may have the small inclination, and a depth of the second through holes 20 may be deepened. When the depth of the second through holes 20 is deepened, a length of a second redistribution via of the second redistribution wire may be long.

The light irradiated onto the second photosensitive insulating layer 114 may be blocked by the light blocking layer 116. The light blocking layer 116 may prevent the light from being irradiated onto the first photosensitive insulating layer 112.

Then, third through holes 24 may be formed within the light blocking layer 116 that is exposed from the second through holes 20 of the second photosensitive insulating layer 114. Portions of the second photosensitive insulating layer 114 or the light blocking layer 116 may be removed by a plasma descum process.

Figure 10:
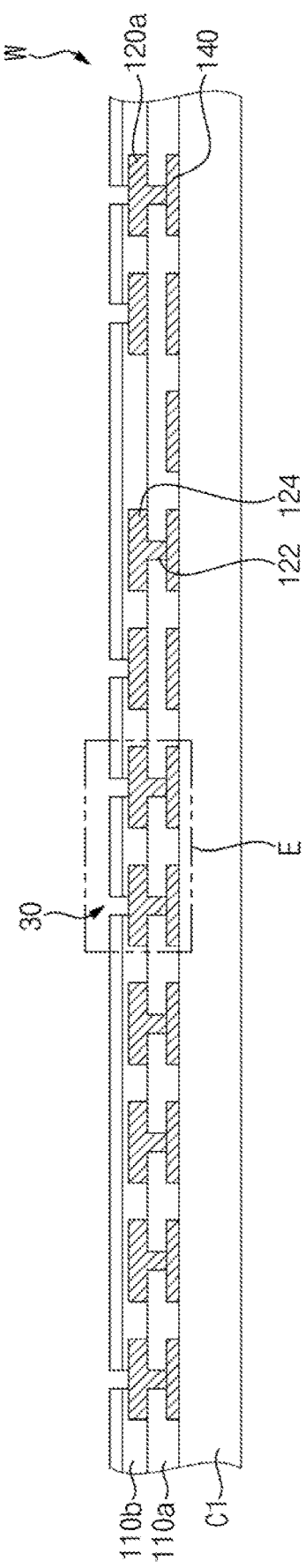
Figure 11:
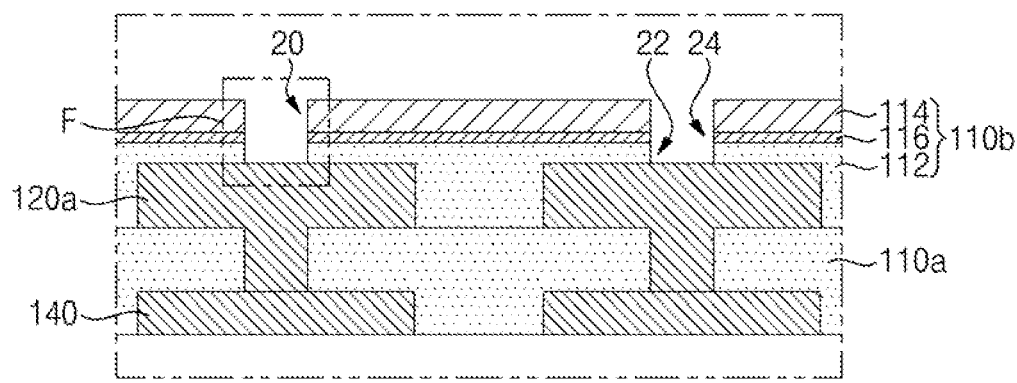
Figure 12:
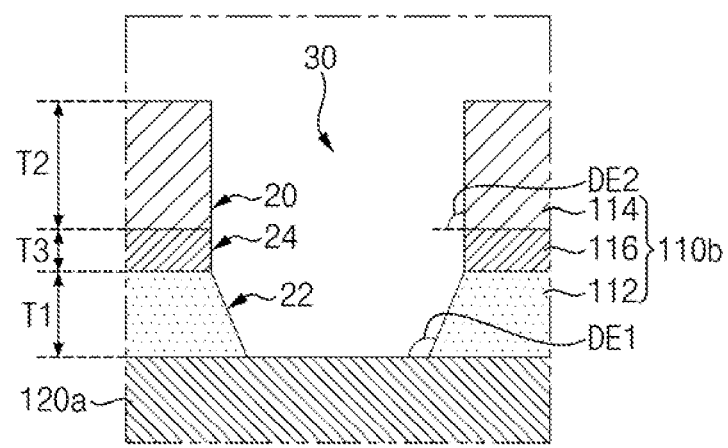

FIG. 11 is enlarged cross-sectional views illustrating portion 'E' in FIG. 10. FIG. 12 is enlarged cross-sectional views illustrating portion 'F' in FIG. 11.

Referring to FIGS. 10 to 12, first through holes 22 may be formed within the first photosensitive insulating layer 112 to provide a space to form the second redistribution wires.

First, the light may be irradiated onto the second photosensitive insulating layer 114, and onto the first photosensitive insulating layer 112 that is exposed through the second and third through holes 20 and 24.

A second mask may be arranged on the second photosensitive insulating layer 114, and the light may be irradiated onto the second mask. The second mask may have second patterns of or corresponding to the second through holes 20. At least some of the light may pass through the second pattern, and may be irradiated onto the first photosensitive insulating layer 112, and at least some of the other light may be blocked by the second mask.

In an implementation, the light may be irradiated onto the first photosensitive insulating layer 112 without arranging the second mask. The second photosensitive insulating layer 114 may have been hardened by the previous exposure to light, and the light may be radiated onto the first photosensitive insulating layer 112 at the same time as the light is radiated onto the second photosensitive insulating layer 114.

Portions of the first photosensitive insulating layer 112 irradiated by the light may have a molecular structure that collapses or deteriorates in response to the light. The portions of the first photosensitive insulating layer 112 irradiated by the light may be removed to form the first through holes 22.

When the light having a strong light intensity is irradiated onto the first photosensitive insulating layer 112, the molecular structure of the portions of the first photosensitive insulating layer 112 irradiated by the light may be completely decomposed, and the first photosensitive insulating layer 112 may not leave residues. The portions of the first photosensitive insulating layer 112 irradiated by the light may be removed through the wet developing process or the dry developing process.

The first through hole 22 of the first photosensitive insulating layer 112 may have a first thickness T1. The first through hole 22 may have a tapered first sidewall profile. The sidewall of the first through hole 22 may have a first angle DE1 from a horizontal direction. In an implementation, the first thickness T1 may be within a range of 1 μm to 5 μm. The first angle DE1 may be within an obtuse angle range of 100 degrees to 140 degrees.

The second through hole 20 of the second photosensitive insulating layer 114 may have a second thickness T2. The second through hole 20 may have a second sidewall profile. A sidewall of the second through hole 20 may have a second angle DE2 from the horizontal direction. In an implementation, the second thickness T2 may be within a range of 5 μm to 50 μm. The second angle DE2 may be within a range of 80 degrees to 100 degrees.

The third through hole 24 of the light blocking layer 116 may have a third thickness. In an implementation, the third thickness T3 may be within a range of 0.1 μm to 1 μm.

Portions of each of the first and second photosensitive insulating layers 112 and 114 and the light blocking layer 116 may be removed to form an opening 30 within the second lower insulating layer 110b. The first through hole 22 of the first photosensitive insulating layer 112 may constitute a first portion of the opening 30. The second through hole 20 of the second photosensitive insulating layer 114 may constitute a second portion of the opening 30. The third through hole 24 of the light blocking layer 116 may constitute a third portion of the opening 30.

The opening 30 may extend from an upper surface of the second lower insulating layer 110b to an upper surface of the first redistribution wire 120a. A depth of the opening 30 of the second lower insulating layer 110b may be increased through the first photosensitive insulating layer 112. The opening 30 of the second lower insulating layer 110b may not leave residues due to the second photosensitive insulating layer 114.

Figure 13:
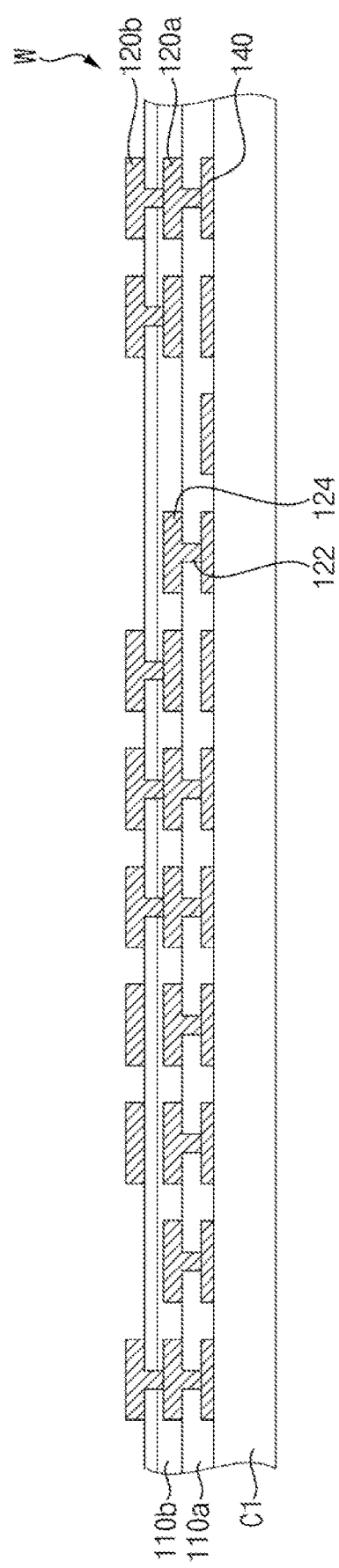
Figure 14:
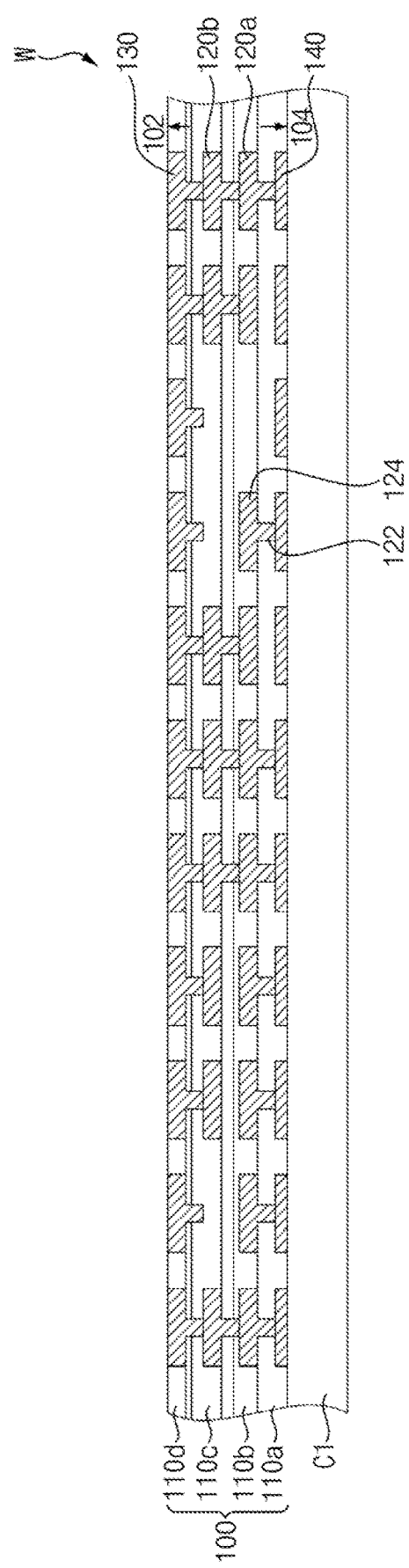

Referring to FIGS. 13 and 14, second redistribution wires 120b and first bonding pads 130 may be formed to complete the first redistribution wiring layer 100.

First, the second redistribution wires 120b (directly contacting the first redistribution wires 120a through the openings) may be formed on the second lower insulating layer 110b.

After a seed layer is formed on a portion of the second lower insulating layer 110b and the opening, the seed layer may be patterned and an electroplating process may be performed to form the second redistribution wire 120b. Thus, portions of the second redistribution wires 120b may directly contact the first redistribution wires 120a through the openings, respectively.

In an implementation, the second redistribution wire may include aluminum (Al), copper (Cu), tin (Sn), nickel (Ni), gold (Au), platinum (Pt), or an alloy thereof.

Then, processes the same as or similar to the processes described with reference to FIGS. 5 to 12 may be performed to form a third lower insulating layer 110c.

After the third lower insulating layer 110c is formed on the second lower insulating layer 110b to cover the second redistribution wire 120b, the third lower insulating layer 110c may be patterned to form a third opening that exposes the second redistribution wire 120b. The first bonding pads 130 may be formed on the third lower insulating layer 110c to directly contact the second redistribution wires 120b through the third openings.

Then, after a fourth lower insulating layer 110d is formed on the third lower insulating layer 110c to cover the first bonding pads 130, the fourth lower insulating layer 110d may be patterned to form fourth openings that expose the first bonding pads 130.

Figure 15:
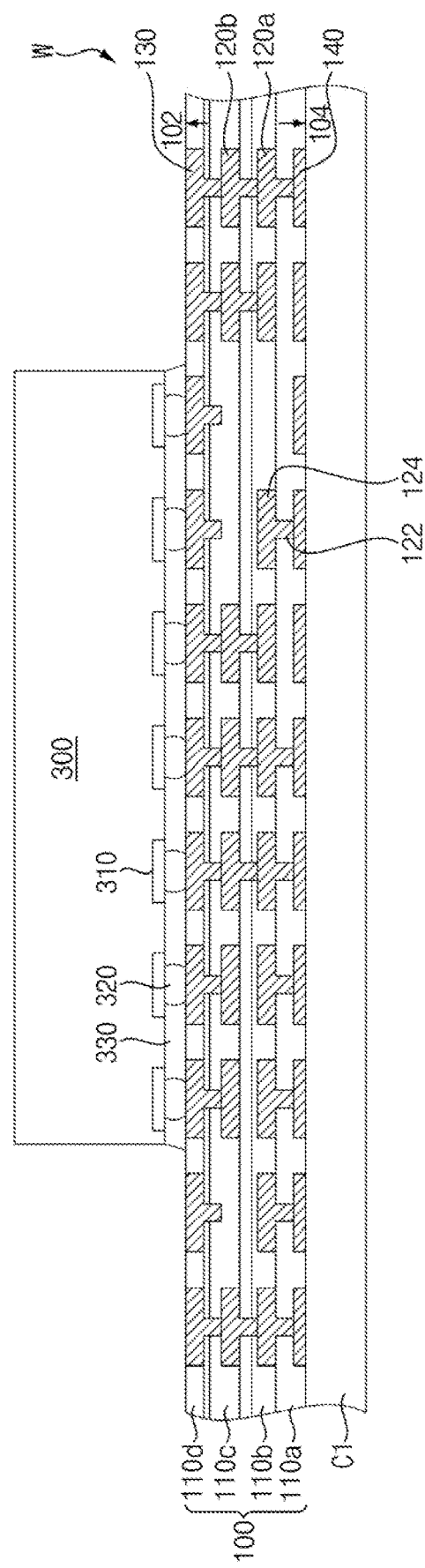
Figure 16:
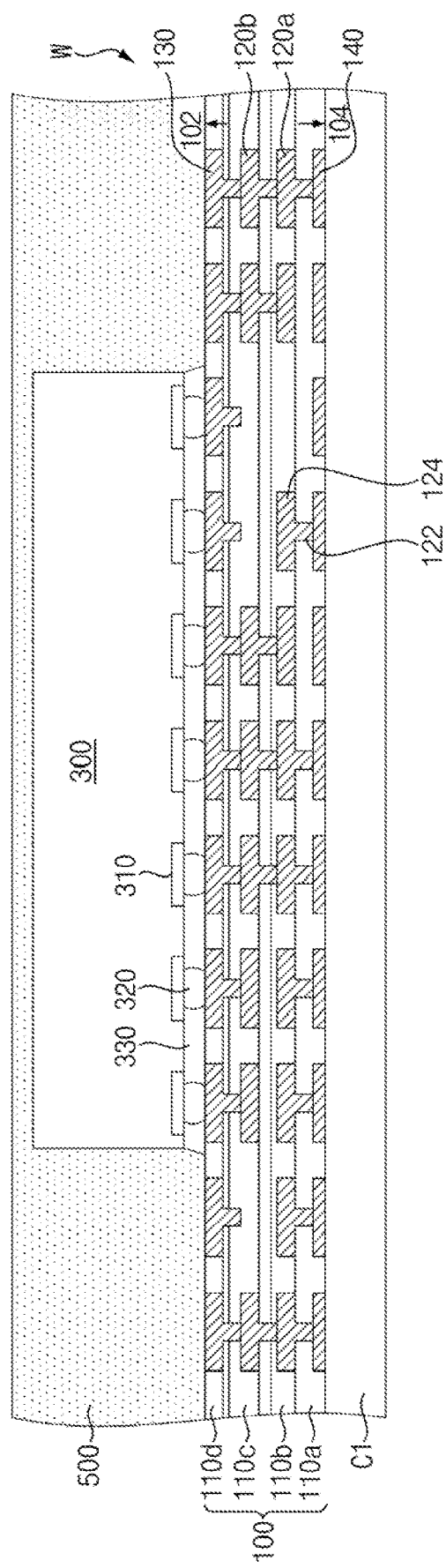

Referring to FIGS. 15 and 16, after a first semiconductor device 300 is disposed on the first redistribution wiring layer 100 of the semiconductor wafer, a molding member 500 may be formed on the first redistribution wiring layer 100 to cover the first semiconductor device 300.

In an implementation, the first semiconductor device 300 may be disposed on the first redistribution wiring layer 100 by a flip chip bonding method. The first semiconductor device 300 may be on a chip mounting region of the first redistribution wiring layer 100. First chip pads 310 of the first semiconductor device 300 may be electrically connected to the first bonding pads 130 of the first redistribution wiring layer 100 through first conductive bumps 320. In an implementation, the first conductive bumps 320 may include micro bumps (uBumps).

Then, a first adhesive member 330 may be filled between the first redistribution wiring layer 100 and the first semiconductor device 300. In an implementation, the first adhesive member 330 may include an epoxy material to reinforce a space between the first redistribution wiring layer 100 and the first semiconductor device 300.

In an implementation, the molding member 500 may include an epoxy molding compound (EMC). The molding member 500 may include UV resin, polyurethane resin, silicone resin, or silica filler.

Figure 17:
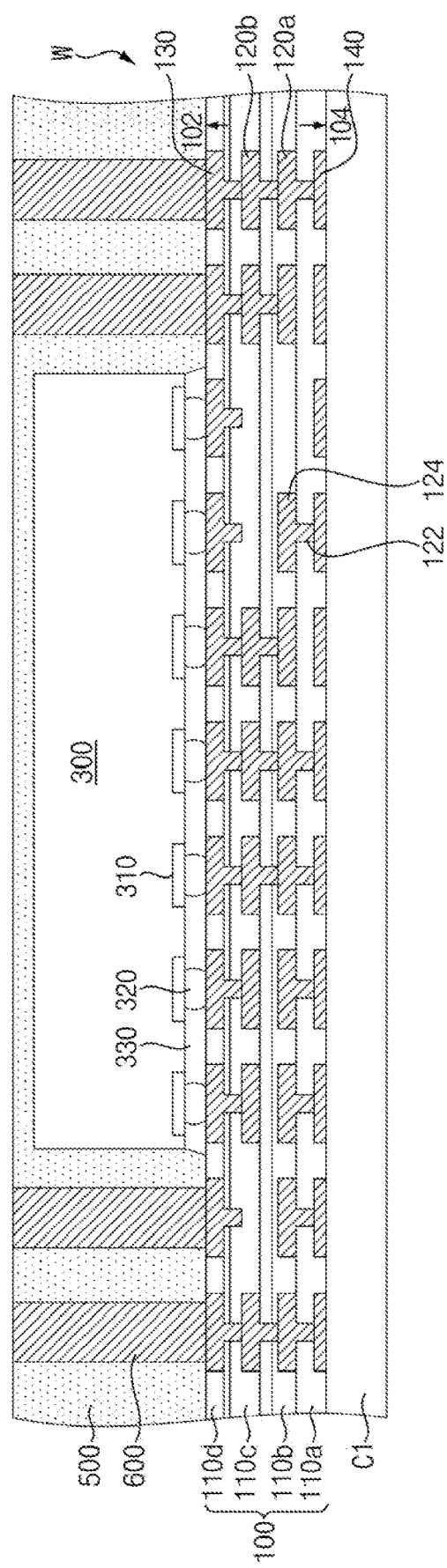

Referring to FIG. 17, a plurality of conductive connectors 600 may be formed on the first redistribution wiring layer 100 to penetrate the molding member 500 in a vertical direction.

First, an upper surface of the molding member 500 may be covered with a photoresist layer. Then, an exposure process may be performed on the photoresist layer to form through structures that expose the first bonding pads 130, respectively.

The conductive connectors 600 may be formed within the through structures that penetrate the photoresist layer in the vertical direction. The electroplating process may be performed on the through structures to form the conductive connectors 600. In an implementation, the conductive connector 600 may be formed by a plating process, an electroless plating process, a vapor deposition process, or the like. The conductive connector 600 may include a pillar shape or a bump shape.

Then, the photoresist layer may be removed to form conductive connectors 600 that extend from the first bonding pads 130, respectively. In an implementation, first, the conductive connectors 600 may be formed on the first bonding pads 130 of the first redistribution wiring layer 100, and then, the molding member 500 may be formed on the first redistribution wiring layer 100 to cover the previously formed conductive connectors 600. The conductive connectors 600 may be formed around the first semiconductor device 300 on the first redistribution wiring layer 100.

The upper surface of the molding member 500 may be partially removed by a grinding process such as a chemical mechanical polishing (CMP) process. Thus, a thickness of the molding member 500 may be reduced to a desired thickness. One end of the conductive connector 600 may be exposed at the upper surface of the molding member 500.

Figure 18:
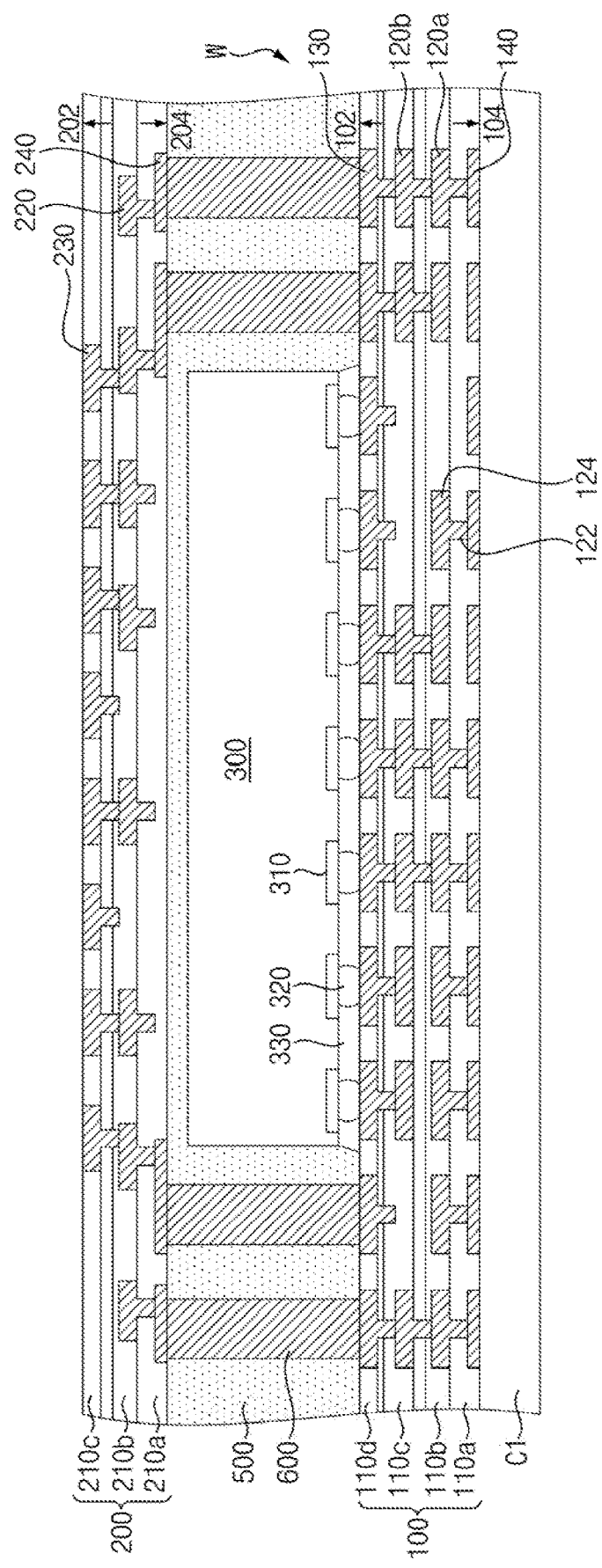

Referring to FIG. 18, processes the same as or similar to the processes described with reference to FIGS. 4 to 14 may be performed to form the second redistribution wiring layer (upper redistribution wiring layer) 200 on the semiconductor wafer W.

First, second connecting pads 240 may be formed on the molding member 500. The second connecting pads 240 may be respectively formed on upper surfaces of the conductive connectors 600.

Then, after a fifth upper insulating layer 210a is formed on the upper surface of the molding member 500 to cover the second connecting pads 240, the fifth upper insulating layer 210a may be patterned to form fifth openings that expose the second connecting pads 240.

Third or upper redistribution wires 220 may be formed on the fifth upper insulating layer 210a to directly contact the second connecting pads 240 through the fifth openings. After a seed layer is formed within a portion of the fifth upper insulating layer 210a and the fifth opening, the seed layer may be patterned and the electroplating process may be performed to from the third redistribution wires 220. Thus, at least a portion of the third redistribution wires 220 may directly contact the second connecting pads 240 through the fifth openings.

Then, after a sixth upper insulating layer 210b is formed on the fifth upper insulating layer 210a to cover the third redistribution wires 220, the sixth upper insulating layer 210b may be patterned to form sixth openings that expose the third redistribution wire 220. Second bonding pads 230 may be formed on the sixth upper insulating layer 210b to directly contact the third redistribution wire 220 through the sixth openings. In an implementation, the sixth upper insulating layer 210b may include the light blocking layer between the first photosensitive insulating layer and the second photosensitive insulating layer.

Then, after a seventh upper insulating layer 210c is formed on the sixth upper insulating layer 610b to cover the second bonding pads 230, the seventh upper insulating layer 210c may be patterned to form seventh openings that expose the second bonding pads 230.

Figure 19:
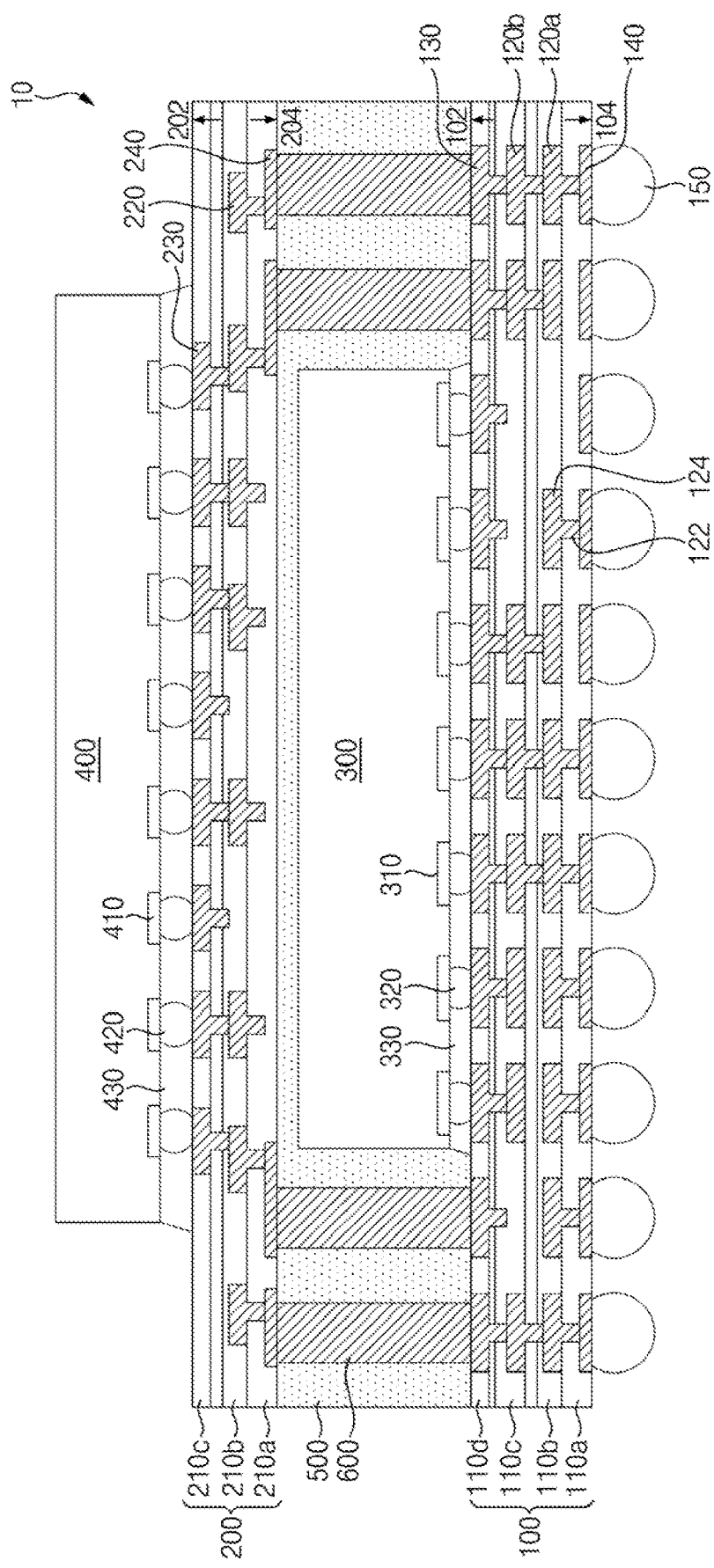

Referring to FIG. 19, processes the same as or similar to the processes described with reference to FIG. 15 may be performed to arrange the second semiconductor device 400 on the second redistribution wiring layer 200 of the semiconductor wafer, to form external connection bumps 150 on the first connecting pads 140 of the first redistribution wiring layer 100, and to complete the semiconductor package 10 by cutting the semiconductor wafer.

In an implementation, the second semiconductor device 400 may be on the second redistribution wiring layer 200 by a flip chip bonding method. The second semiconductor device 400 may be on a chip mounting region of the second redistribution wiring layer 200. Second chip pads 410 of the second semiconductor device 400 may be electrically connected to the second bonding pads 230 of the second redistribution wiring layer 200 through second conductive bumps 420. In an implementation, the second conductive bumps 420 may include micro bumps (uBumps).

Then, a second adhesive member 430 may be filled between the second redistribution wiring layer 200 and the second semiconductor device 400. In an implementation, the second adhesive member 430 may include an epoxy material to reinforce a space between the second redistribution wiring layer 200 and the second semiconductor device 400.

Then, the external connection bumps 150 may be formed on the first connecting pads 140 of the first redistribution wiring layer 100.

The external connection bump 150 may be formed on the first connecting pad 140. In an implementation, after a temporary opening of a second photoresist pattern is filled up with a conductive material, the second photoresist pattern may be removed and a reflow process may be performed to form the external connection bumps 150. In an implementation, the conductive material may be formed by a plating process. In an implementation, the external connection bumps 150 may be formed by a screen printing method, a deposition method, or the like. In an implementation, the external connection bump 150 may include a C4 bump.

Then, the semiconductor wafer may be cut to complete the semiconductor package 10 in FIG. 1. The semiconductor wafer may be cut along a scribe lane region. The semiconductor wafer may be cut by a dicing process.

As described above, the first photosensitive insulating layer 112 may include the positive photosensitive insulating material, and the second photosensitive insulating layer 114 may include the negative photosensitive insulating material. The lower insulating layers 110*a*, 110*b*, 110*c*, and 110*d* and upper insulating layers 210*a*, 210*b*, and 210*c* may not leave the residues through or due to the first photosensitive insulating layer 112, and a thickness of the lower insulating layers 110*a*, 110*b*, 110*c*, and 110*d* and upper insulating layers 210*a*, 210*b*, and 210*c* may be increased due to the second photosensitive insulating layer 114. In an implementation, the first photosensitive insulating layer 112 irradiated with a high amount of light may not leave the residues. Even when the thickness of the second photosensitive insulating layer 114 increases, the second through hole 20 having a small or no inclination angle may be formed in the second photosensitive insulating layer 114 irradiated with ultraviolet light having straightness or linearity. The inclination angle of the second through hole 20 of the second photosensitive insulating layer 114 may be small or nonexistent, and the redistribution via having no pitch limit may be formed.

In an implementation, when the thickness of the second photosensitive insulating layer 114 increases, a cross talk phenomenon between the first and second redistribution wires 120*a* and 120*b* may be prevented.

Figure 20:
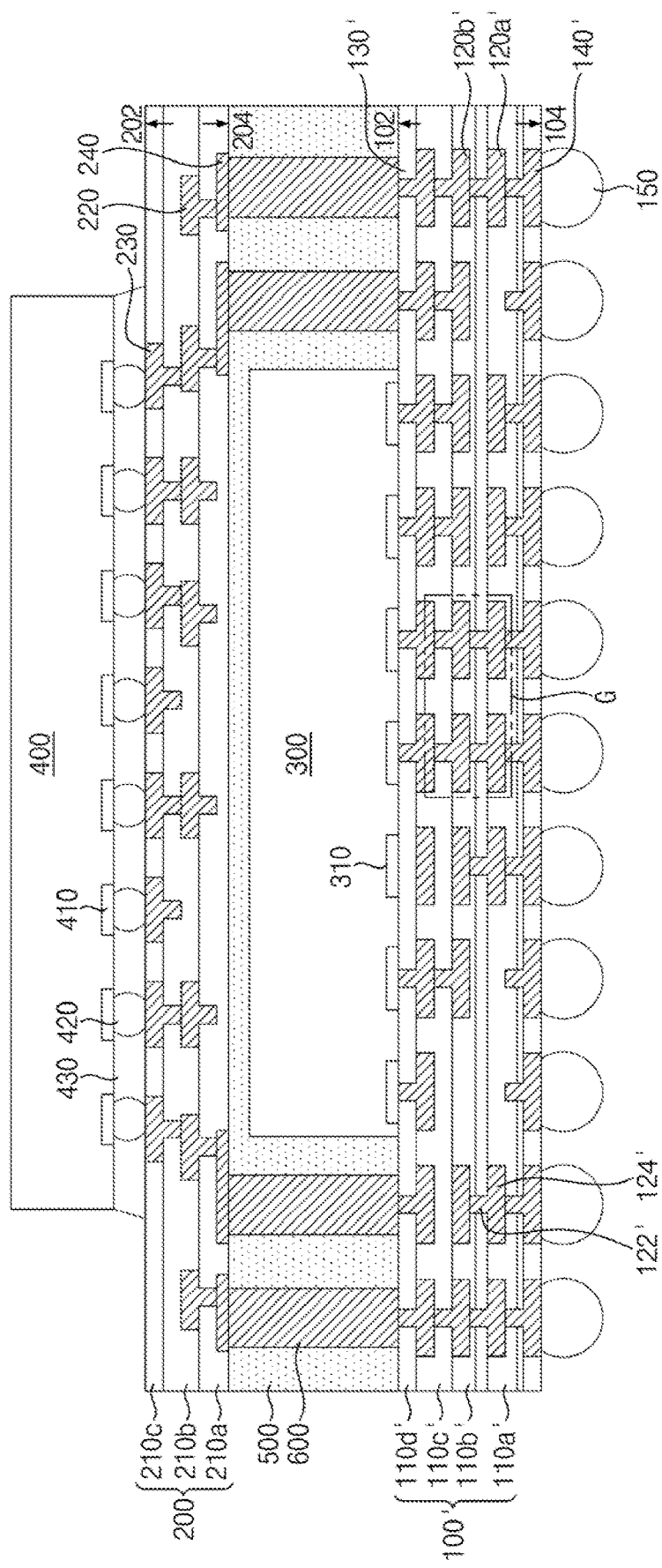
FIG. 20 is a cross-sectional view illustrating a semiconductor package in accordance with example embodiments.
Figure 21:
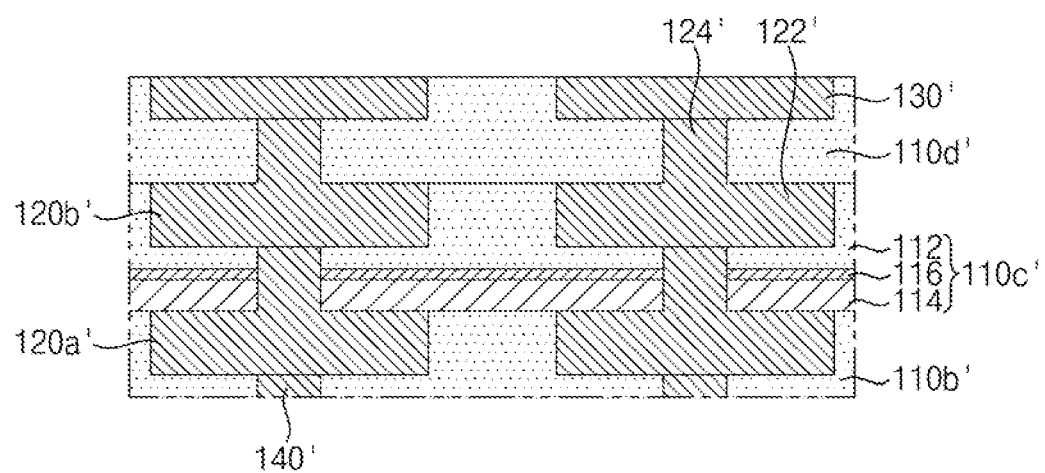
FIG. 21 is an enlarged cross-sectional view illustrating portion 'G' in FIG. 21.

FIG. 20 is a cross-sectional view illustrating a semiconductor package in accordance with example embodiments. FIG. 21 is an enlarged cross-sectional view illustrating portion 'G' in FIG. 21. The semiconductor package may be substantially the same as or similar to the semiconductor package described with reference to FIGS. 1 to 3 except for a configuration of the first redistribution wiring layer. Thus, same or similar components are denoted by the same or similar reference numerals, and repeated descriptions of the same components may be omitted.

Referring to FIGS. 20 and 21, a semiconductor package 12 may include the first and second redistribution wiring layers 100 and 200, the first semiconductor device 300 on the first redistribution wiring layer 100, and the conductive connectors 600 electrically connecting the first and second redistribution wiring layers 100 and 200 to each other. The semiconductor package 12 may further include the molding member 500 on the first redistribution wiring layer 100 and covering the first semiconductor device 300, the second redistribution wiring layer 200 on the molding member 500, and the second semiconductor device 400 on the second redistribution wiring layer 200.

In an implementation, the first redistribution wiring layer 100 may include a plurality of lower insulating layers 110*a*', 110*b*', 110*c*', and 110*d*', and redistribution wires 120*a*' and 120*b*' in the lower insulating layers. The first redistribution wiring layer 100' may have the first upper surface 102 and the first lower surface 104 opposite to each other. The redistribution wires 120*a*' and 120*b*' may include first and second redistribution wires 120*a*' and 120*b*'. The redistribution wires 120*a*' and 120*b*' may electrically connect the first and second semiconductor devices 300 and 400. In addition, first bonding pads 130' and first connecting pads 140' may be included.

The redistribution wires may include a redistribution via 122' within an opening that penetrates the insulating layer, and a redistribution line 124' stacked on the redistribution via and extending along the lower surface of the corresponding insulating layer. In an implementation, the redistribution via 122' may be on the redistribution line 124' toward the first upper surface 102 of the first redistribution wiring layer 100'. In an implementation, the semiconductor package 12 may include a chip first structure. The redistribution wires may include, e.g., aluminum (Al), copper (Cu), tin (Sn), nickel (Ni), gold (Au), platinum (Pt), or an alloy thereof.

By way of summation and review, when a distance between insulating layers is short, a cross talk phenomenon could occur between adjacent redistribution wires. In a positive photosensitive insulating layer, a via may have an opening that has a tapered shape or sidewall profile. As a thickness of the insulating layer increases, a diameter of an upper portion of the via may increase greatly due to the tapered shape. In the process of forming the via, pitch limitations could occur. A negative photosensitive insulating layer could generate a residue by a reflected light.

One or more embodiments may provide a semiconductor package including an insulating structure layer having a positive photosensitive insulating layer that does not generate residue and a negative photosensitive insulating layer with increased thickness.

The first photosensitive insulating layer may include a positive photosensitive insulating material, and the second photosensitive insulating layer may include a negative photosensitive insulating material. The insulating layer may not leave residues through the first photosensitive insulating layer, and a thickness of the insulating layer may be increased through the second photosensitive insulating layer. The first photosensitive insulating layer irradiated with a high amount of light may not leave the residues. Even when the thickness of the second photosensitive insulating layer increases, a through hole having a small inclination angle may be formed in the second photosensitive insulating layer irradiated with ultraviolet light having straightness. Since the inclination angle of the through hole of the second photosensitive insulating layer is small, the redistribution via having no pitch limit may be formed.

Also, when the thickness of the second photosensitive insulating layer increases, a cross talk phenomenon between the first and second redistribution wires may be prevented.

One or more embodiments may provide a semiconductor package including a plurality of stacked different semiconductor chips.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a lower redistribution wiring layer having a first surface and a second surface opposite to the first surface; and
a first semiconductor device on the lower redistribution wiring layer, the first semiconductor device being connected to the lower redistribution wiring layer via conductive bumps,
wherein the lower redistribution wiring layer includes:
a first redistribution wire in a first lower insulating layer;
an insulating structure layer having an opening that exposes at least a portion of the first redistribution wire, the insulating structure layer including a first photosensitive insulating layer, a light blocking layer on the first photosensitive insulating layer, and a second photosensitive insulating layer on the light blocking layer;
a second redistribution wire in the opening of the insulating structure layer, the second redistribution wire including a redistribution via contacting the first redistribution wire, and a redistribution line stacked on the redistribution via; and
bonding pads bonded to the conductive bumps and electrically connected to the second redistribution wire.

2. The semiconductor package as claimed in claim 1, further comprising:
a molding member covering the first semiconductor device on the lower redistribution wiring layer;
a conductive connector penetrating the molding member around the first semiconductor device, the conductive connector being electrically connected to the bonding pads; and
an upper redistribution wiring layer on the molding member, the upper redistribution wiring layer being electrically connected to the lower redistribution wiring layer through the conductive connector.

3. The semiconductor package as claimed in claim 2, further comprising a second semiconductor device stacked on the upper redistribution wiring layer.

4. The semiconductor package as claimed in claim 1, wherein:
the first photosensitive insulating layer includes a first through hole therein having a tapered first sidewall profile, the first through hole constituting a first portion of the opening, and
a sidewall of the first through hole has a first angle from a horizontal direction, the first angle being within a range of 100 degrees to 140 degrees.

5. The semiconductor package as claimed in claim 1, wherein:
the second photosensitive insulating layer includes a second through hole therein having a second sidewall profile, the second through hole constituting a second portion of the opening, and
a sidewall of the second through hole has a second angle from a horizontal direction, the second angle being within a range of 80 degrees to 100 degrees.

6. The semiconductor package as claimed in claim 1, wherein:
the first photosensitive insulating layer includes a positive photosensitive insulating material, and
the second photosensitive insulating layer includes a negative photosensitive insulating material.

7. The semiconductor package as claimed in claim 1, wherein the light blocking layer includes a metal oxide, a metal nitride, a metal carbide, a metal boride, an organic resin, an inorganic filler, or an organic filler.

8. The semiconductor package as claimed in claim 1, wherein each of the first and second photosensitive insulating layers independently includes a polyimide, plumbate oxide, polyhydroxystyrene, benzocyclobutene, or an acrylic material.

9. The semiconductor package as claimed in claim 1, wherein the bonding pad is on the redistribution line.

10. The semiconductor package as claimed in claim 1, wherein the bonding pad is on the redistribution via.

11. A method of manufacturing a semiconductor package, the method comprising:
forming a lower redistribution wiring layer having a first lower insulating layer such that the first lower insulating layer includes a plurality of first redistribution wires therein;
sequentially forming a first photosensitive insulating layer, a light blocking layer, and a second photosensitive insulating layer on the first lower insulating layer to cover the first redistribution wires;
forming a second through hole penetrating the second photosensitive insulating layer to expose the light blocking layer;
etching the light blocking layer exposed through the second through hole to expose the first photosensitive insulating layer;
forming a first through hole penetrating the first photosensitive insulating layer to expose the first redistribution wire; and
forming a second redistribution wire electrically connected to the first redistribution wire through the first and second through holes.

12. The method as claimed in claim 11, further comprising:
arranging a first semiconductor device on the lower redistribution wiring layer such that the first semiconductor device is electrically connected to the second redistribution wire through conductive bumps;
forming a molding member on the lower redistribution wiring layer to cover the first semiconductor device;
forming a conductive connector penetrating the molding member around the first semiconductor device such that the conductive connector is electrically connected to the second redistribution wire; and
arranging an upper redistribution wiring layer on the molding member such that the upper redistribution wiring layer is electrically connected to the second redistribution wire through the conductive connector.

13. The method as claimed in claim 12, further comprising arranging a second semiconductor device on the upper redistribution wiring layer.

14. The method as claimed in claim 11, wherein:
the first through hole has a tapered first sidewall profile, and
a sidewall of the first through hole has a first angle from a horizontal direction, the first angle being within a range of 100 degrees to 140 degrees.

15. The method as claimed in claim 11, wherein:
the second through hole has a second sidewall profile, and
a sidewall of the second through hole has a second angle from a horizontal direction, the second angle being within a range of 80 degrees to 100 degrees.

16. The method as claimed in claim 11, wherein:
the first photosensitive insulating layer includes a positive photosensitive insulating material, and
the second photosensitive insulating layer includes a negative photosensitive insulating material.

17. The method as claimed in claim 11, wherein the light blocking layer includes a metal oxide, a metal nitride, a metal carbide, a metal boride, an organic resin, an inorganic filler, or an organic filler.

18. The method as claimed in claim 11, wherein each of the first and second photosensitive insulating layers independently includes a polyimide, plumbate oxide, polyhydroxystyrene, benzocyclobutene, or an acrylic material.

19. The method as claimed in claim 11, wherein etching the light blocking layer further includes removing at least a portion of the light blocking layer by a plasma descum process.

20. A semiconductor package, comprising:
a lower redistribution wiring layer having upper and lower surfaces opposite to each other, the lower redistribution wiring layer having bonding pads that are exposed at the upper surface;
a first semiconductor device on the lower redistribution wiring layer, the first semiconductor device being connected to the lower redistribution wiring layer via conductive bumps;
a molding member covering the first semiconductor device on the lower redistribution wiring layer;
a conductive connector penetrating the molding member around the first semiconductor device, the conductive connector being electrically connected to the bonding pads;
an upper redistribution wiring layer on the molding member, the upper redistribution wiring layer being electrically connected to the lower redistribution wiring layer through the conductive connector; and
a second semiconductor device on the upper redistribution wiring layer,
wherein the lower redistribution wiring layer includes:
an insulating layer having an opening that exposes at least a portion of a first redistribution wire, the insulating layer including a positive photosensitive insulating layer, a light blocking layer on the positive photosensitive insulating layer, and a negative photosensitive insulating layer on the light blocking layer; and
a second redistribution wire in the opening of the insulating layer, the second redistribution wire contacting the at least a portion of the first redistribution wire.

* * * * *